(12) United States Patent
Dixit et al.

(10) Patent No.: US 11,682,514 B2
(45) Date of Patent: Jun. 20, 2023

(54) MEMORY CELL HAVING A FREE FERROMAGNETIC MATERIAL LAYER WITH A CURVED, NON-PLANAR SURFACE AND METHODS OF MAKING SUCH MEMORY CELLS

(71) Applicant: GLOBALFOUNDRIES U.S. Inc., Santa Clara, CA (US)

(72) Inventors: Hemant Dixit, Halfmoon, NY (US); Vinayak Bharat Naik, Singapore (SG); Kazutaka Yamane, Singapore (SG)

(73) Assignee: GlobalFoundries U.S. Inc., Santa Clara, CA (US)

( * ) Notice: Subject to any disclaimer, the term of this patent is extended or adjusted under 35 U.S.C. 154(b) by 373 days.

(21) Appl. No.: 16/997,065

(22) Filed: Aug. 19, 2020

(65) Prior Publication Data

US 2022/0059754 A1 Feb. 24, 2022

(51) Int. Cl.
| | | |
|---|---|---|
| *H01F 10/32* | (2006.01) | |
| *H10B 61/00* | (2023.01) | |
| *H10N 50/80* | (2023.01) | |
| *H10N 50/01* | (2023.01) | |
| *H10N 50/10* | (2023.01) | |
| *H10N 50/85* | (2023.01) | |

(52) U.S. Cl.
CPC ....... *H01F 10/3254* (2013.01); *H01F 10/329* (2013.01); *H01F 10/3286* (2013.01); *H10B 61/00* (2023.02); *H10B 61/22* (2023.02); *H10N 50/01* (2023.02); *H10N 50/10* (2023.02); *H10N 50/80* (2023.02); *H10N 50/85* (2023.02)

(58) Field of Classification Search
CPC ....... H01L 43/02; H01L 27/228; H01L 43/12; H01L 43/10; H01F 10/3286; H01F 10/329; H01F 10/3254; H10N 50/20; H10N 50/85; H10N 50/01; H10N 50/80; H10N 50/10; H10B 61/22; H10B 61/00
USPC ........................................................ 257/421
See application file for complete search history.

(56) References Cited

U.S. PATENT DOCUMENTS

| 8,803,263 B2 | 8/2014 | Yamada et al. |
| 9,543,508 B2 | 1/2017 | Yamada et al. |

(Continued)

FOREIGN PATENT DOCUMENTS

WO 2010/026831 A1 11/2010

OTHER PUBLICATIONS

Cai et al., "High Performance MRAM with Spin-Transfer-Torque and Voltage-Controlled Magnetic Anisotropy Effects," Applied Sciences, 7, 929, 2017.

*Primary Examiner* — Jami Valentine Miller
(74) *Attorney, Agent, or Firm* — Yee Tze Lim; Hoffman Warnick LLC

(57) ABSTRACT

An illustrative memory cell disclosed herein includes a bottom electrode, a top electrode positioned above the bottom electrode and an MTJ (Magnetic Tunnel Junction) structure positioned above the bottom electrode and below the top electrode. In this example, the MTJ structure includes a first ferromagnetic material layer positioned above the bottom electrode, a non-magnetic insulation layer positioned above the first ferromagnetic material layer and a second ferromagnetic material layer positioned on the non-magnetic insulation layer, wherein there is a curved, non-planar interface between the non-magnetic insulation layer and the ferromagnetic material layer.

20 Claims, 8 Drawing Sheets

(56) References Cited

U.S. PATENT DOCUMENTS

| | | | |
|---|---|---|---|
| 9,853,206 B2 | 12/2017 | Pinarbasi et al. | |
| 10,529,399 B2 | 1/2020 | Ohsawa et al. | |
| 11,475,932 B2* | 10/2022 | Higo | G11C 11/15 |
| 2004/0188733 A1* | 9/2004 | Asao | H01L 27/228 |
| | | | 257/E27.005 |
| 2009/0057654 A1* | 3/2009 | Saito | H01L 43/08 |
| | | | 257/E29.323 |
| 2010/0003767 A1* | 1/2010 | Cho | H01L 27/228 |
| | | | 257/E21.001 |
| 2010/0276733 A1* | 11/2010 | Li | H01L 27/1446 |
| | | | 257/E29.166 |
| 2011/0316102 A1* | 12/2011 | Ohmori | G11C 11/161 |
| | | | 257/E29.323 |
| 2012/0326712 A1* | 12/2012 | Tudosa | G01R 33/093 |
| | | | 324/252 |
| 2013/0015540 A1* | 1/2013 | Choi | H01L 43/02 |
| | | | 257/E43.001 |
| 2014/0299952 A1* | 10/2014 | Choi | H01L 43/02 |
| | | | 257/421 |
| 2017/0125665 A1 | 5/2017 | Yamada et al. | |
| 2019/0148630 A1* | 5/2019 | Haq | H01L 43/02 |
| | | | 257/421 |
| 2022/0181061 A1* | 6/2022 | Roiz-Wilson | H01F 10/329 |

* cited by examiner

MEMORY CELL HAVING A FREE FERROMAGNETIC MATERIAL LAYER WITH A CURVED, NON-PLANAR SURFACE AND METHODS OF MAKING SUCH MEMORY CELLS

BACKGROUND OF THE INVENTION

Field of the Invention

The present disclosure generally relates to the fabrication of integrated circuits, and, more particularly, to various novel embodiments of a memory cell with a free ferromagnetic material layer having a curved, non-planar surface and various novel methods of makings such memory cells on an integrated circuit (IC) product.

Description of the Related Art

There are many forms of memory technologies that take advantage of known STT (spin transfer torque) techniques to achieve switching of the magnetization direction of a layer of a ferromagnetic material. One such cell is an STT-MRAM (spin transfer torque magnetic random-access memory) cell. A typical STT-MRAM cell comprises an MTJ (magnetic tunnel junction) structure positioned between a bottom electrode and a top electrode. The MTJ structure typically comprises a tunnel barrier layer (e.g., MgO) positioned between a pinned (or reference) ferromagnetic material layer and a free ferromagnetic material layer. Typically, the bottom electrode contacts the pinned layer and the top electrode contacts the free layer. In an array of such STT-MRAM cells, the bottom electrode of each STT-MRAM cell is typically coupled to a word line and the top electrode is coupled to a bit line.

The logic state stored in the device depends on the relative orientation between the magnetization direction of the free layer and the magnetization direction of the pinned layer. The relative orientation between the magnetization directions of the free layer and the pinned layer may have either a parallel orientation (designated by the letter "P") or an antiparallel orientation (designated by the letters "AP"). In the parallel orientation (P), the magnetization direction orientation of the free layer and the magnetization direction orientation of the pinned layer are substantially the same. In the antiparallel orientation (AP), the magnetization direction orientation of the free layer and the magnetization direction orientation of the pinned layer are opposite of one another. When the MTJ structure is in the parallel orientation state, the MTJ structure is in a relatively low resistance state. Conversely, when the MTJ structure is in the antiparallel state, the MTJ structure is in a relatively high resistance state. In one illustrative embodiment, the parallel orientation of the MTJ structure may represent a logical "0" while the antiparallel orientation of the MTJ structure may represent a logical "1." The critical current ($I_C$) of the MTJ structure is the current that can cause the free layer to switch from one magnetization direction orientation to another magnetization direction orientation. Known "read" sensing circuitry is included on the IC product for sensing whether a logical "0" or a logical "1" is stored on a particular STT-MRAM device. In operation, the current flow from the pinned layer to the free layer has to "tunnel through" the tunnel barrier layer.

Device designers are under constant pressure to produce STT-MRAM cells with ever faster switching speeds. However, the switching speed of STT-MRAM cells have a random probability distribution or pattern that may be analyzed statistically but may not be predicted precisely. Typically, a relatively high current is needed to increase the switching speed of an STT-MRAM cell. However, such increased currents result in an undesirable increase in power consumption by the IC product incorporating such STT-MRAM cells.

The present disclosure is directed to various novel embodiments of a memory cell with a free ferromagnetic material layer having a curved, non-planar surface and various novel methods of makings such memory cells on an IC product.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a memory cell with a free ferromagnetic material layer having a curved, non-planar surface and various novel methods of makings such memory cells on an IC product. An illustrative memory cell disclosed herein includes a bottom electrode, a top electrode positioned above the bottom electrode and an MTJ (Magnetic Tunnel Junction) structure positioned above the bottom electrode and below the top electrode. In this example, the MTJ structure includes a first ferromagnetic material layer positioned above the bottom electrode, a non-magnetic insulation layer positioned above the first ferromagnetic material layer and a second ferromagnetic material layer positioned on the non-magnetic insulation layer, wherein there is a curved, non-planar interface between the non-magnetic insulation layer and the ferromagnetic material layer.

BRIEF DESCRIPTION OF THE DRAWINGS

The disclosure may be understood by reference to the following description taken in conjunction with the accompanying drawings, in which like reference numerals identify like elements, and in which.

Figure 1:
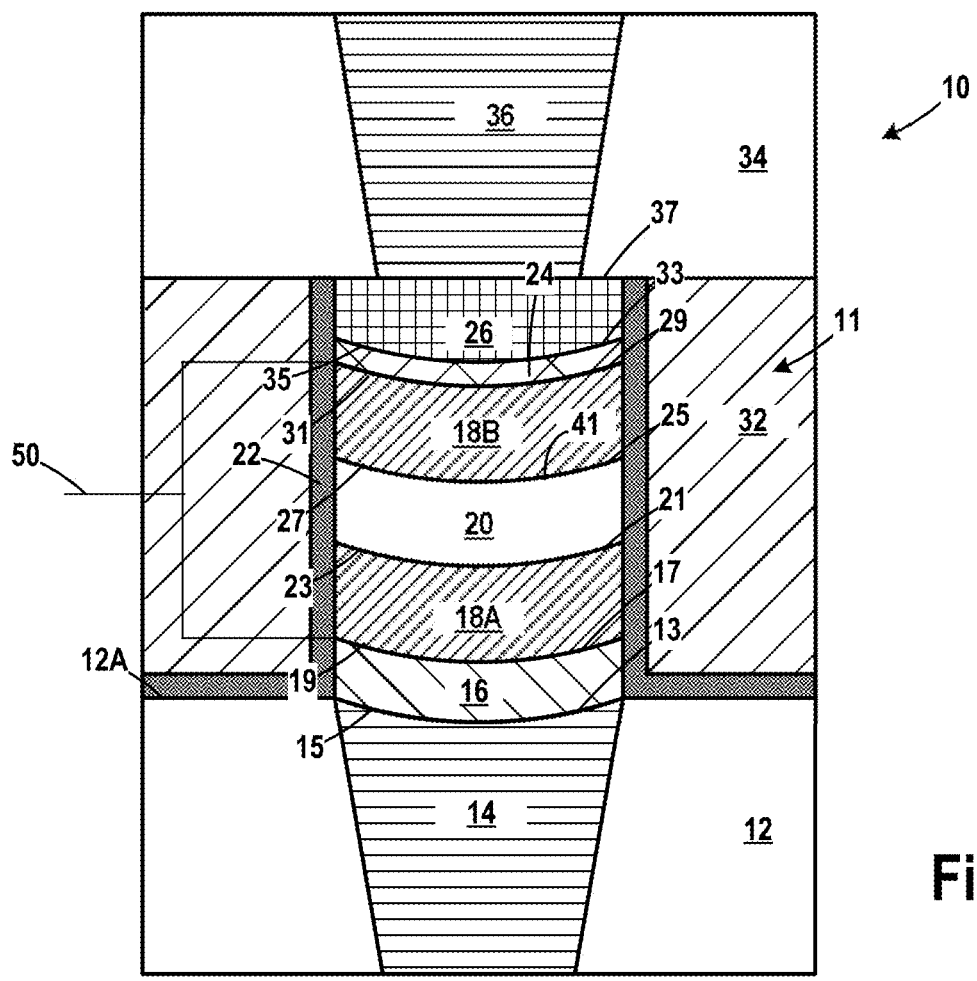
FIGS. 1-15 depict various novel embodiments of a memory cell with a free ferromagnetic material layer having a curved, non-planar surface and various novel methods of making such memory cells on an IC product. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the various embodiments of the STT-MRAM device disclosed herein may be incorporated into any type of integrated circuit product, e.g., it may be a stand-alone memory product, a product where memory circuits are embedded with logic circuits, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-15 depict various novel embodiments of a memory cell 11 with a free ferromagnetic material layer having a curved, non-planar surface and various novel methods of makings such memory cells 11 on an IC product 10. In the illustrative example described and depicted herein, the memory cell is an STT-MRAM cell. Of course, after a complete reading of the present application, those skilled in the art will appreciate that the presently disclosed inventions may be applied to any type of memory technology that uses the STT effect for switching such as, for example, spin-orbit torque (SOT) MRAM, voltage-controlled magnetic anisotropy (VCMA) MRAM, etc. Thus, the claimed inventions should not be considered to be limited to the illustrative STT-MRAM technology depicted herein.

The IC product 10 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of semiconductor materials other than silicon. Thus, the terms "substrate" or "semiconductor substrate" should be understood to cover all semiconductor materials and all forms of such semiconductor materials.

Prior to performing the processing operations shown in FIG. 1, various transistor devices (not shown in FIG. 1), as well as various conductive contact structures (not shown in FIG. 1) that are coupled to those transistor devices, were formed in and above the semiconductor substrate. For example, at this point in the process flow, a transistor (not shown) that functions as a read switching element for the STT-MRAM cell 11, as well as perhaps other CMOS-based transistors (not shown) for other non-memory circuits (such as peripheral logic circuits), would have been formed on the IC product 10 by performing traditional manufacturing techniques.

In the depicted example, the IC product 10 comprises a layer of insulating material 12 (e.g., silicon dioxide, a low-k (k value less than 3.3)) and a conductive structure 14, (e.g., a conductive via) positioned in the layer of insulating material 12. The conductive structure 14 may be comprised of any conductive material, it may be of any desired configuration, and it may be manufactured using any of a variety of different known manufacturing techniques (e.g., single or dual damascene). As depicted, in one illustrative embodiment, the conductive structure 14 has a convex upper surface 13 relative to the substantially horizontally oriented upper surface (not shown) of the semiconductor substrate (not shown). As will be appreciated by those skilled in the art after a complete reading of the present application, the conductive structure 14 will be conductively coupled to a bottom electrode of a novel STT-MRAM cell 11 disclosed herein.

The illustrative STT-MRAM cell 11 in FIG. 1 comprises a bottom electrode 16, a plurality of layers of material for an MTJ (Magnetic Tunnel Junction) structure 50, and a top electrode 26. The bottom electrode 16 may be formed to any desired thickness and it may be formed of any conductive material, e.g., a metal-containing material, a metal compound, etc. In one illustrative embodiment, the bottom electrode 16 may be comprised of tantalum nitride. The top electrode 26 may be formed to any desired thickness and it may be formed of any conductive material, e.g., a metal-containing material, a metal compound, etc. In one illustrative embodiment, the top electrode 26 may be comprised of tantalum nitride. The bottom and top electrodes 16, 26 need not be formed of the same conductive material (nor have the same thickness), but that situation may occur in some applications.

The MTJ structure 50 depicted herein may be comprised of a variety of different materials, with a variety of different thicknesses, that are arranged in a variety of different configurations. In one illustrative embodiment, the MTJ structure 50 may be comprised of a pinned (or reference) ferromagnetic material layer 18A, a free ferromagnetic material layer 18B and a non-magnetic insulation layer 20, such as, for example, a tunnel oxide layer. In the depicted example, an optional top insulation layer 24, e.g., an oxide material, is positioned on the top of the free ferromagnetic material layer 18B to enhance its magnetic anisotropy in p-MTJ devices.

The pinned ferromagnetic material layer 18A may be formed to any desired thickness, e.g., 1-5 nm, and it may be comprised of any of a plurality of ferromagnetic materials, e.g., a Co/Pt or Co/Ni multi-layer, Co, Fe, Ni, a CoFeB alloy, etc. Although the pinned ferromagnetic material layer 18A is simplistically depicted as a single layer of material in the attached drawings, in a real-world device, the pinned ferromagnetic material layer 18A may comprise multiple layers of material arranged in a variety of different stack configurations (from top to bottom).

The free ferromagnetic material layer 18B may be formed to any desired thickness, e.g., 1-3 nm, and it may be comprised of any of a plurality of ferromagnetic materials, e.g., a Co/Pt or Co/Ni multi-layer, Co, Fe, Ni, a CoFeB alloy, etc. Although the free ferromagnetic material layer 18B is simplistically depicted as a single layer of material in the attached drawings, in a real-world device, the free ferromagnetic material layer 18B may comprise multiple layers of material arranged in a variety of different stack configurations (from top to bottom). The pinned ferromagnetic material layer 18A and free ferromagnetic material layer 18B need not be formed of the same ferromagnetic material (s) (nor have the same thickness), but that situation may occur in some applications.

In one illustrative embodiment, the non-magnetic insulation layer 20 may comprise an oxide-based insulating material, e.g., MgO, $Al_2O_3$, $TiO_x$, AlTiO, MgZnO, ZnO, $Ga_2O_3$, etc., and it may be formed to any desired thickness. The top insulation layer 24 may be formed of any insulating material, e.g., MgO, etc., and it may be formed to any desired thickness. The non-magnetic insulation layer 20 and the top insulation layer 24 need not be formed of the same material (or stack of materials), nor formed with the same thickness, but that situation may occur in some applications.

Also depicted in FIG. 1 is a conformal etch stop layer 22, e.g., silicon nitride, a layer of insulating material 32, e.g., silicon dioxide, a low-k material, etc., a layer of insulating material 34, e.g., silicon dioxide, a low-k material, etc., and a conductive structure 36, e.g., a conductive via that is positioned in the layer of insulating material 34 and conductively coupled to the top electrode 26. The conductive structure 36 may be made of the same material as that of the conductive structure 14, but that may not be the case in all applications.

With continued reference to FIG. 1, in one illustrative embodiment, the bottom electrode 16 is positioned on and in physical contact with the conductive structure 14, the pinned ferromagnetic material layer 18A is positioned on and in physical contact with the bottom electrode 16, the non-magnetic insulation layer 20 is positioned on and in physical contact with the pinned ferromagnetic material layer 18A, the free ferromagnetic material layer 18B is positioned on and in physical contact with the non-magnetic insulation layer 20, the top insulation layer 24 is positioned on and in physical contact with the free ferromagnetic material layer 18B and the top electrode 26 is positioned on and in physical contact with the top insulation layer 24.

FIG. 1 is a cross-sectional view taken through the center of the MTJ structure 50 and the overall STT-MRAM cell 11. As will be appreciated by those skilled in the art after a complete reading of the present application, the various structures of the novel STT-MRAM cell 11 disclosed herein comprise one or more curved surfaces relative to a substantially horizontally oriented reference surface such as, for example, a substantially horizontally oriented upper surface (not shown) of the semiconductor substrate (not shown). As noted above, in one illustrative embodiment, the conductive structure 14 comprises a curved or dished upper surface 13. In one illustrative arrangement, the curved or dished upper surface 13 of the conductive structure 14 engages a curved or dished bottom surface 15 of the bottom electrode 16; the bottom electrode 16 comprises a curved or dished upper surface 17 that engages a curved or dished bottom surface 19 of the pinned ferromagnetic material layer 18A; the pinned ferromagnetic material layer 18A comprises a curved or dished upper surface 21 that engages a curved or dished bottom surface 23 of the non-magnetic insulation layer 20; the non-magnetic insulation layer 20 comprises a curved or dished upper surface 25 that engages a curved or dished bottom surface 27 of the free ferromagnetic material layer 18B; the free ferromagnetic material layer 18B comprises a curved or dished upper surface 29 that engages a curved or dished bottom surface 31 of the top insulation layer 24 and the top insulation layer 24 comprises a curved or dished upper surface 33 that engages a curved or dished bottom surface 35 of the top electrode 26. The top electrode 26 also has a substantially planar upper surface 37.

In the example shown in FIG. 1, all of the curved or dished upper surfaces 13, 17, 21, 25, 29 and 33 and all of the curved or dished lower surfaces 15, 19, 23, 27, 31 and 35 are convex surfaces relative to a substantially horizontally oriented reference upper surface (not shown) of the semiconductor substrate (not shown). Of course, after a complete reading of the present application, those skilled in the art will appreciate that, in other embodiments, the curvature of these surfaces could be reversed, i.e., all of the curved or dished upper surfaces 13, 17, 21, 25, 29 and 33 and all of the curved or dished lower surfaces 15, 19, 23, 27, 31 and 35 could be concave surfaces relative to the substantially horizontally oriented upper surface (not shown) of the semiconductor substrate (not shown). Importantly, with reference to FIG. 1, the convex upper surface 25 of the non-magnetic insulation layer 20 and the convex lower surface 27 of the free ferromagnetic material layer 18B define a curved, non-planar or dished interface 41 between the non-magnetic insulation layer 20 and the free ferromagnetic material layer 18B, and in particular a convex interface 41. As will be described more fully below, the presence of the novel curved, non-planar or dished interface 41 between the non-magnetic insulation layer 20 and the free ferromagnetic material layer 18B will cause the magnetization direction of the free ferromagnetic material layer 18B to be non-perpendicular and the magnetization direction of the free ferromagnetic material layer 18B to vary spatially from the center to the outer edge of the free ferromagnetic material layer 18B so as to thereby improve the switching speed of the novel STT-MRAM cell 11 as compared to prior art STT-MRAM cells where the various layers of material of the prior art STT-MRAM cells were substantially planar layers of material. However, as will be appreciated by those skilled in the art after a complete reading of the present application, in some applications, it may not be required that all of the layers of material of the MTJ structure 50 have both a curved upper surface and a curved bottom surface, as is the case in the depicted example in FIG. 1. Moreover, there may be a difference in the degree of curvature between various layers of material. For example, the degree of curvature of the curved, non-planar or dished interface 41 may be different than the degree of curvature between the interface defined by the bottom surface 23 of the non-magnetic insulation layer 20 and the upper surface 21 of the pinned ferromagnetic material layer 18A.

Figure 2:
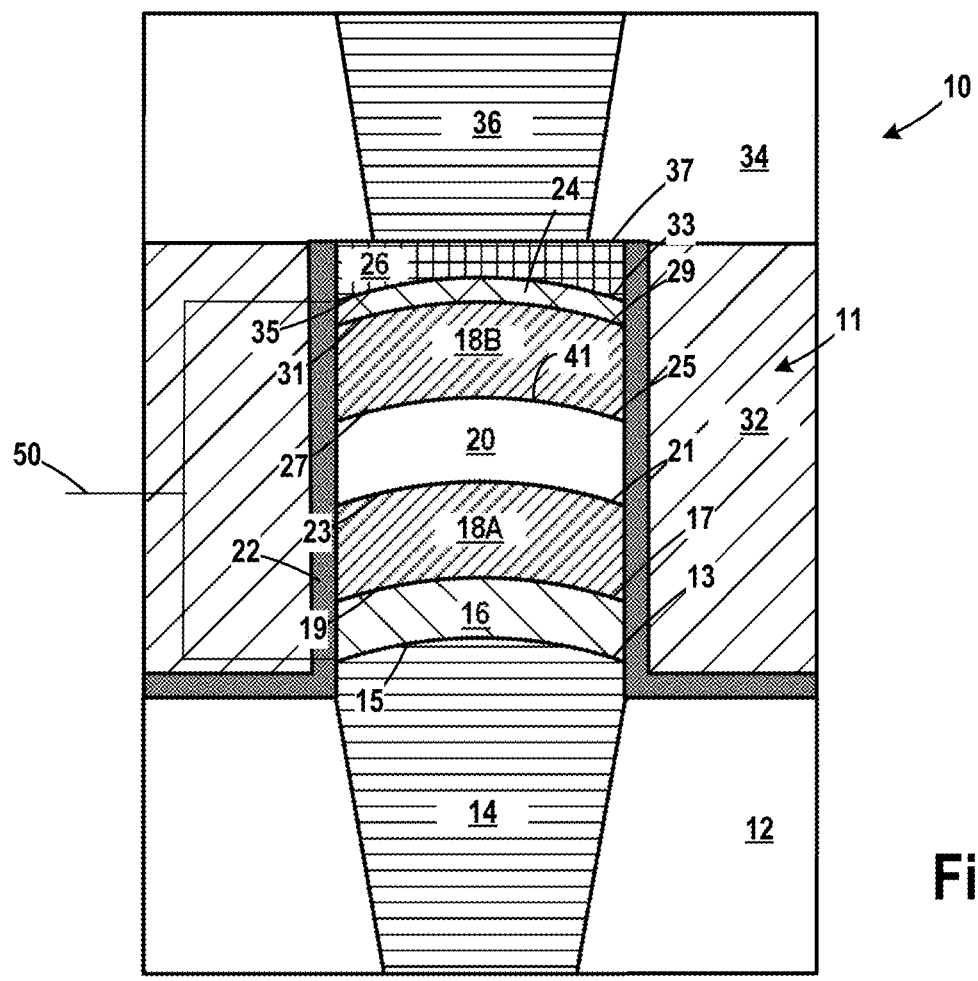

FIG. 2 depicts an embodiment of the novel STT-MRAM cell 11 disclosed herein wherein the materials of the MTJ structure 50 are concave surfaces relative to a substantially horizontally oriented upper surface (not shown) of the semiconductor substrate (not shown)—a configuration that is opposite to that depicted in FIG. 1. That is, in this example, all of the upper surfaces 13, 17, 21, 25, 29 and 33 are concave surfaces and all of the lower surfaces 15, 19, 23, 27, 31 and 35 are concave surfaces relative to the substantially horizontally oriented upper surface (not shown) of the semiconductor substrate (not shown). For example, the novel curved, non-planar or dished interface 41 between the non-magnetic insulation layer 20 and the free ferromagnetic material layer 18B is defined by the engagement between the concave upper surface 25 of the non-magnetic insulation layer 20 and the concave bottom surface 27 of the free ferromagnetic material layer 18B. That is, in this example, the interface 41 is a concave interface between the non-magnetic insulation layer 20 and the free ferromagnetic material layer 18B. In this particular example, the conductive structure 14 has a concave upper surface 13 that engages a concave lower surface 15 of the bottom electrode 16. Additionally, a concave upper surface 33 of the top insulation layer 24 engages a concave bottom surface 35 of the top electrode 26.

Figure 3:
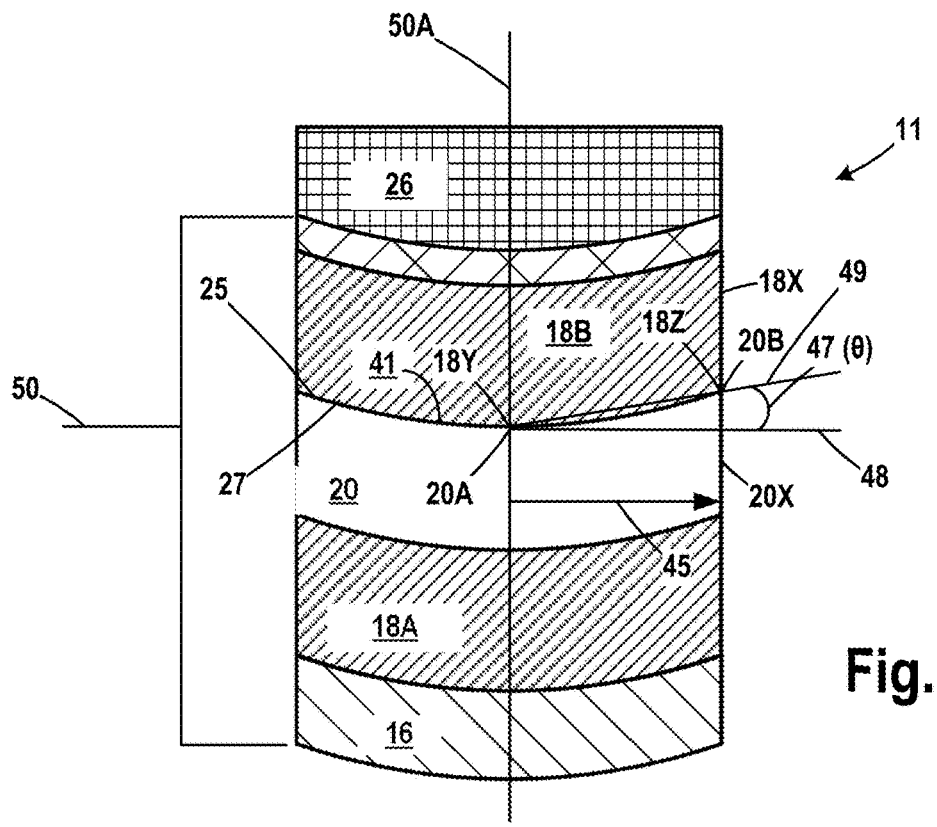

FIG. 3 is an enlarged cross-sectional view of the MTJ structure 50 shown in FIG. 1 taken through a centerline 50A of the MTJ structure 50. The free ferromagnetic material layer 18B has an outer cylindrical surface 18X located at a radius 45 from the centerline 50A, a center 18Y along the centerline 50A and a surface 18Z at the outer surface 18X. The magnitude of the radius 45 may vary depending upon the particular application. The non-magnetic insulation layer 20 has a cylindrical outer surface 20X, a center 20A along the centerline 50A and an uppermost and outermost surface 20B along the outer surface 20X. The surface 20B engages the surface 18Z of the free ferromagnetic material layer 18B.

Also depicted in FIG. 3 is a horizontal reference line 48 and a line 49 that extends through the center 20A and the uppermost surface 20B of the non-magnetic insulation layer 20. The lines 48 and 49 define an interfacial angle 47 (θ). Typically, prior art STT-MRAM cells are comprised of substantially planar layers of material with substantially planar surfaces, wherein the interfacial angle 47 is approximately zero degrees, and wherein the interfacial PMA is uniaxial, i.e., substantially parallel to the centerline of such prior art STT-MRAM cells across the entire diameter of such prior art STT-MRAM cells. However, in the novel STT-MRAM cells 11 disclosed herein, the interfacial angle 47 (θ) is intentionally made to be greater than zero which, as will be discussed more fully below, results in a canted interfacial magnetic orientation of the free ferromagnetic material layer 18B and enables faster switching of the novel STT-MRAM cells 11 disclosed herein as compared to prior art STT-MRAM cells with a substantially uniaxial PMA. In one particular embodiment, the interfacial angle 47 (θ) may be greater than about 2 degrees. In one more specific embodiment, the interfacial angle 47 (θ) may fall within the range (inclusively) of 2-4 degrees.

The inventors have discovered that, in one illustrative example, a shear strain of greater than approximately 4% is needed at the outer surface 18X of the free ferromagnetic material layer 18B to change the magnetization direction of the free ferromagnetic material layer 18B to a canted magnetization direction that is different from the standard uniaxial PMA of prior art STT-MRAM cells. Thus, in the illustrative example where the MTJ structure 50 has a diameter of approximately 50 nm and wherein the interfacial angle 47 (θ) is about 2 degrees, the uppermost and outermost surface 20B of the non-magnetic insulation layer 20 should be approximately 1 nm higher than the center 20A of the non-magnetic insulation layer 20, i.e., the uppermost and outermost surface 20B should be about 1 nm above the horizontal reference surface 48. This height differential will also be present between the center 18Y and the surface 18Z of the free ferromagnetic material layer 18B. Of course, the magnitude of this height differential will change depending upon a variety of factors, such as, for example, the diameter of the MTJ structure 50, the magnitude of the interfacial angle 47 (θ), the desired amount of shear strain to be applied to the free ferromagnetic material layer 18B, etc.

Figure 4:
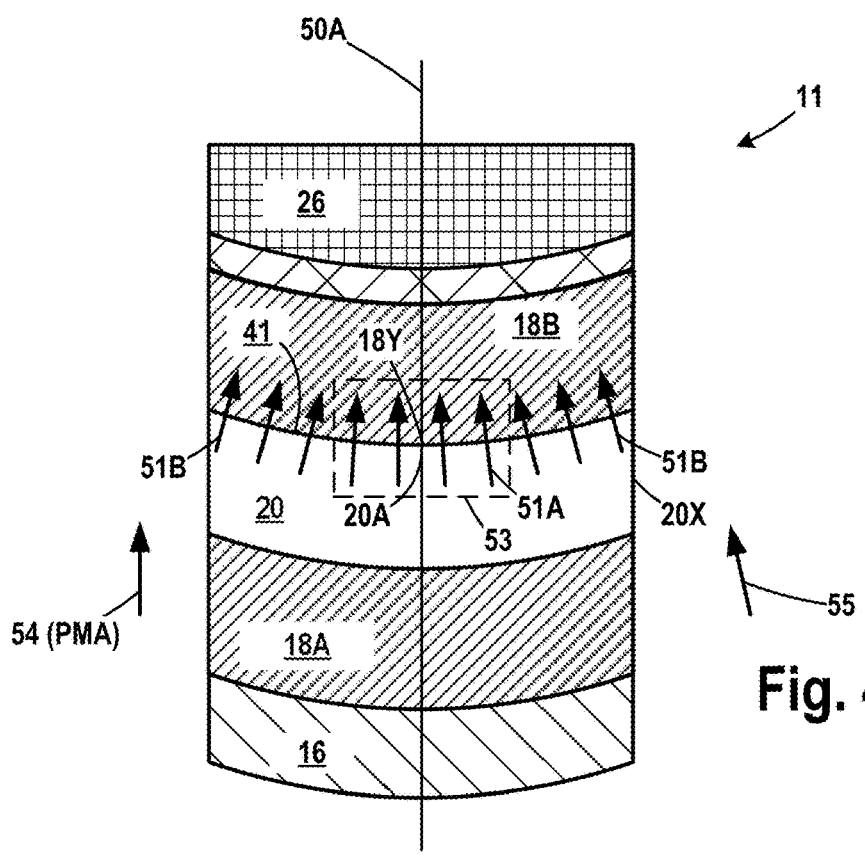

FIG. 4 is cross-sectional view of the MTJ structure 50 taken through the center 18Y of the free ferromagnetic material layer 18B. The cross-sectional view would be the same if the MTJ structure 50 were rotated in any direction and by any amount around the centerline 50A. That is, the upper surface 25 of the non-magnetic insulation layer 20 is a gently curved, dish-like surface to which the lower surface 27 of the free ferromagnetic material layer 18B conforms.

The MTJ structure 50 has a central region (generally indicated by the dashed line region 53) where the magnetization direction of the free ferromagnetic material layer 18B, as reflected by the simplistic arrows MA, is only slightly angled relative to the centerline 50A. At locations very close to the center 18Y of the free ferromagnetic material layer 18B, the magnetization directions MA may be approximately parallel to the centerline 50A. At locations more remote from the center 18Y of the free ferromagnetic material layer 18B, the magnetization directions of the free ferromagnetic material layer 18B, as reflected by the arrows 51B, are more canted or more angled relative to the centerline 50A. Simply put, the magnetization direction of the free ferromagnetic material layer 18B varies as one progresses from the center 18Y to the outer surface 18X of the free ferromagnetic material layer 18B. In some applications, this spatial variation in the magnetization direction of the free ferromagnetic material layer 18B may be substantially linear or it may be substantially non-linear in nature. Ultimately, due to the curved, non-planar dished interface 41, the overall magnetization direction of the free ferromagnetic material layer 18B, as indicated by the arrow 55, is not parallel to the centerline 50A of the MTJ structure 50.

As is known to those skilled in the art, a current, i.e., the critical current, is the current that is necessary to cause the magnetic orientation of the free ferromagnetic material layer 18B to "flip" or change directions, i.e., from a parallel orientation to an antiparallel orientation, or vice-versa, relative to the magnetic orientation of the reference ferromagnetic material layer 18A. When the MTJ structure 50 is in the parallel state, the magnetic orientation of the reference ferromagnetic material layer 18A and the magnetic orientation of the free ferromagnetic material layer 18B are the same, and the angle between those two magnetic orientations is zero. When the MTJ structure 50 is in the antiparallel state, the magnetic orientation of the reference ferromagnetic material layer 18A and the magnetic orientation of the free ferromagnetic material layer 18B are opposite one another, i.e., the angle between those two magnetic orientations is 180 degrees apart.

With prior art STT-MRAM cells comprised of substantially planar layers of material with substantially planar surfaces, when the critical current was applied to the MTJ structure 50, a torque was generated to cause the magnetic orientation of the free ferromagnetic material layer 18B to flip. In theory, with prior art STT-MRAM cells, since the angle between the magnetic orientation direction of the reference ferromagnetic material layer 18A and the magnetic orientation direction of the free ferromagnetic material layer 18B was either zero degrees (parallel state—(sin (0)=0)) or 180 degrees (antiparallel state—(sin 180)=0)), the magnetization direction (PMA) of such prior art cells was substantially parallel to the centerline of such cells across the entire diameter of such cells, and a relatively large critical current was required to flip the magnetic orientation of the free ferromagnetic material layer 18B.

In contrast, due to the presence of the curved, non-planar or dished interface 41 on the novel STT-MRAM 11 disclosed herein, the magnetization direction of Perpendicular Magnetic Anisotropy (PMA) 55 is intentionally oriented at an angle (relative to the centerline 50A) that is greater than zero. As a result of this angled direction of PMA 55, less current is required to generate the necessary torque to flip the magnetic orientation of the free ferromagnetic material layer 18B. Accordingly, the novel STT-MRAM cell 11 disclosed herein consumes less current and has a faster switching speed as compared to prior art STT-MRAM cells comprised of substantially planar layers of material with substantially planar surfaces.

Figure 5:
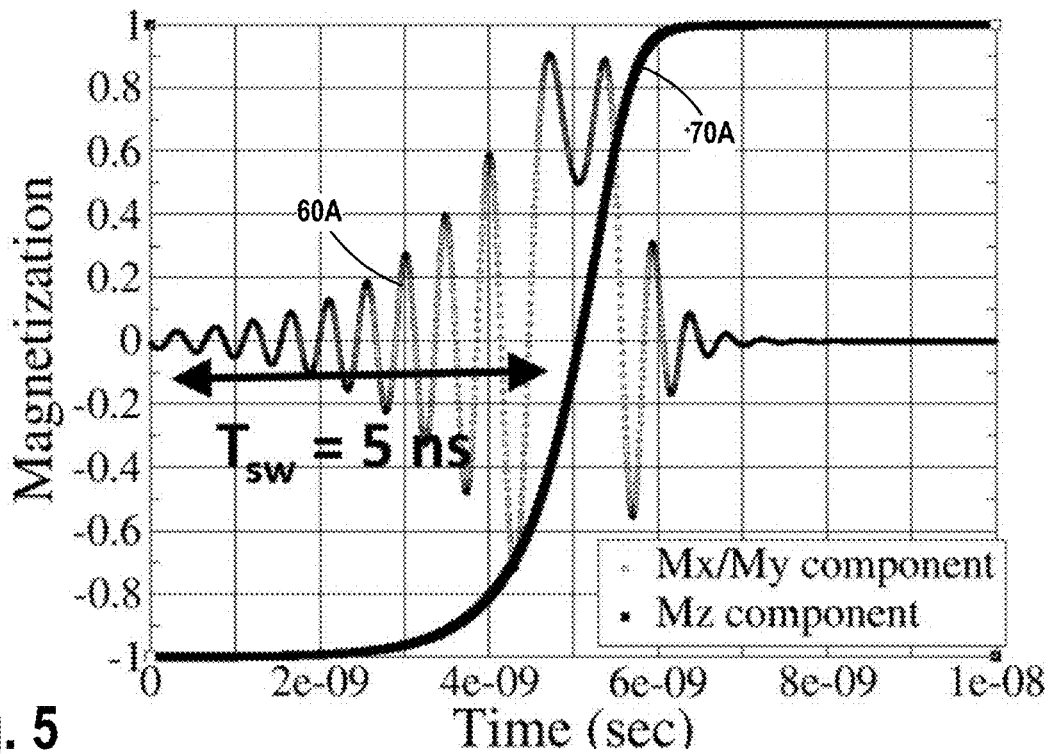
Figure 6:
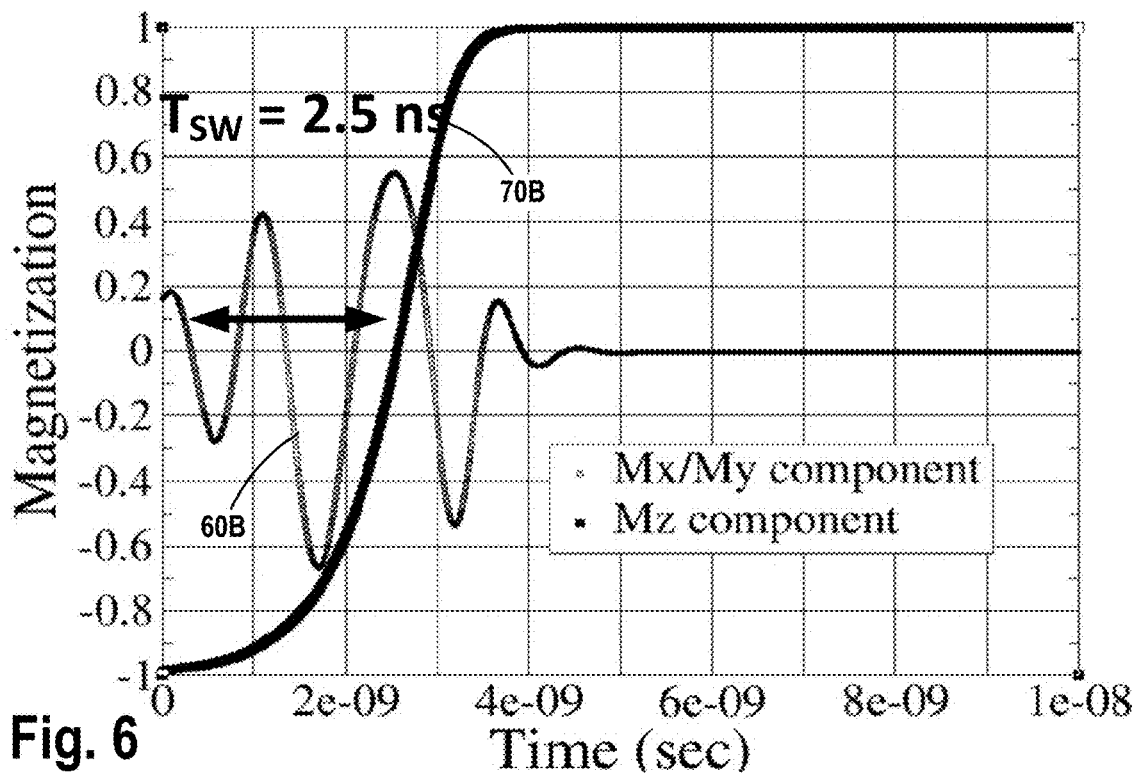

FIGS. 5 and 6 are graphs reflecting simulation data for, respectively, a prior art STT-MRAM cell (comprised of substantially planar layers of material with substantially planar surfaces) and an embodiment of the novel STT-MRAM cells 11 disclosed herein with the curved, non-planar dished interface 41, wherein both of the cells had the same diameter of approximately 70 nm and wherein the interfacial angle 47 (θ) for the novel curved interface STT-MRAM cell 11 disclosed herein was approximately 2 degrees. The simulation was based upon use of a 10 ns current pulse to switch between parallel and antiparallel states. The abscissa reflects time (in seconds), the ordinate reflects the magnetization state of the free ferromagnetic material layer for both devices, wherein the magnetization states Mx, My and Mz are in normalized units.

The line 60A in FIG. 5 reflects the precessional switching motion of the prior art STT-MRAM, while the line 60B in FIG. 6 reflects the precessional switching motion of the novel curved interface STT-MRAM cells 11 disclosed herein. As will be appreciated by those skilled in the art after a complete reading of the present application, due to the curved, non-planar or dished interface 41, the novel STT-MRAM cell 11 disclosed herein undergoes less precessional switching motion, as compared to the prior art STT-MRAM cell. During the precessional switching motion of the prior art STT-MRAM cell, the z-component of magnetization switches from antiparallel (−1 along negative z-axis) to parallel direction (+1 along +z-axis) at approximately 5 ns. In contrast, during the precessional switching motion of the novel curved interface STT-MRAM cell 11 disclosed herein, the z-component of magnetization switches from antiparallel (−1 along negative z-axis) to parallel direction (+1 along +z-axis) at approximately 2.5 ns with an exact pulse width of 10 ns.

The line 70A in FIG. 5 reflects the switching speed of the prior art STT-MRAM, while the line 70B in FIG. 6 reflects the switching speed of the novel curved interface STT-MRAM cell 11 disclosed herein. As will be appreciated by those skilled in the art after a complete reading of the present application, due to the curved, non-planar or dished interface 41, the novel STT-MRAM cell 11 disclosed herein has a faster switching speed as compared to the prior art STT-MRAM cell. More specifically, the switching speed of the novel STT-MRAM cell 11 is about 2.5 ns, whereas the switching speed of the prior art STT-MRAM cell is about 5 ns, an improvement of about 50% in terms of switching speed.

FIGS. 7-11 depict one illustrative process flow for forming the illustrative example of the novel curved interface STT-MRAM cell 11 depicted in FIG. 1. Prior to performing the processing operations shown in FIG. 7, various transistor devices (not shown), as well as various conductive contact structures (not shown) that are coupled to those transistor devices, were formed in and above the semiconductor substrate. For example, at this point in the process flow, a transistor (not shown) that functions as a read switching element for the STT-MRAM cell 11, as well as perhaps other CMOS-based transistors (not shown) for other non-memory circuits (such as peripheral logic circuits), would have been formed for the product 10 using traditional manufacturing techniques.

Figure 7:
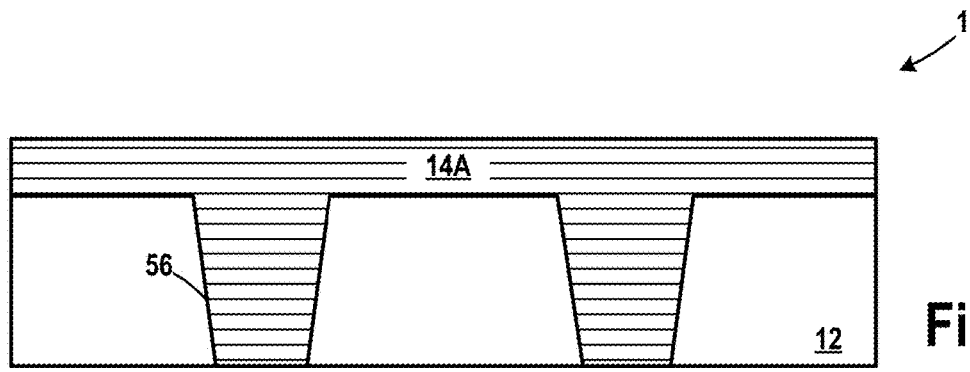

FIG. 7 depicts the IC product 10 after a layer of insulating material 12 (e.g., silicon dioxide, a low-k material (k value less than 3.3), was formed at some level above the substrate. One or more etching processes were performed through a patterned etch mask (not shown) to form a plurality of openings 56 (e.g., via openings) in the layer of insulating material 12. Thereafter, the patterned etch mask was removed. Next, one or more layers of conductive material 14A (that may include various liner layers and bulk conductive material) were formed so as to over-fill the openings 56.

Figure 8:
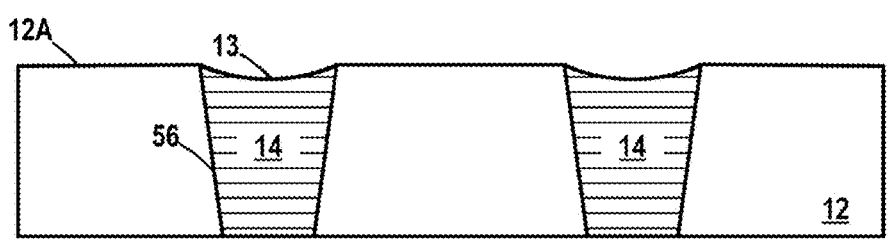

Then, as shown in FIG. 8, one or more CMP and/or etch-back process operations were performed to remove the portions of the layer(s) of conductive material 14A positioned outside of the openings 56 and above the upper surface 12A of the layer of insulating material 12. This results in the formation of a conductive structure 14 in each of the openings 56. Note that, in one illustrative embodiment, the CMP and/or etch-back process operations are intentionally performed in such a manner that the conductive structures 14 have a curved, dished, convex upper surface 13. This is in contrast to at least some prior art techniques where efforts are made to try to form the conductive structures 14 such that the upper surface of the conductive structures is substantially co-planar with the upper surface 12A of the layer of insulating material 12. The degree of curvature of the upper surface 13 may vary depending upon the particular application. The conductive structures 14 may be comprised of any conductive material and they may be of any desired configuration (when viewed from above). As noted above, each of the conductive structures 14 will be conductively coupled to the bottom electrode 16 of a novel STT-MRAM cell 11 disclosed herein.

Figure 9:
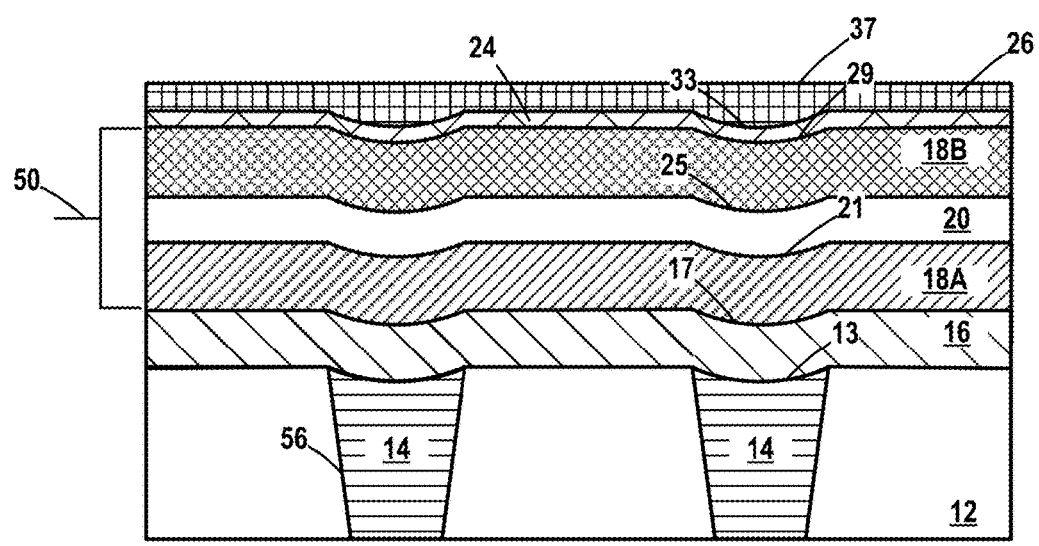

FIG. 9 depicts the IC product 10 after various layers of material were sequentially blanket deposited above the layer of insulating material 12. More specifically, a layer of bottom electrode material 16, a plurality of layers of material for the MTJ structure 50, a layer of top insulation material 24 and a layer of top electrode material 26 were sequentially deposited above the layer of insulating material 12. As depicted, in one illustrative embodiment, as initially deposited, the various deposited layers of material have a curved lower and a curved upper surface at a location above the dished upper surface 13 of the conductive structures 14. Thereafter, a CMP process operation was performed to planarize the upper surface 37 of the layer of top electrode material 26.

Figure 10:
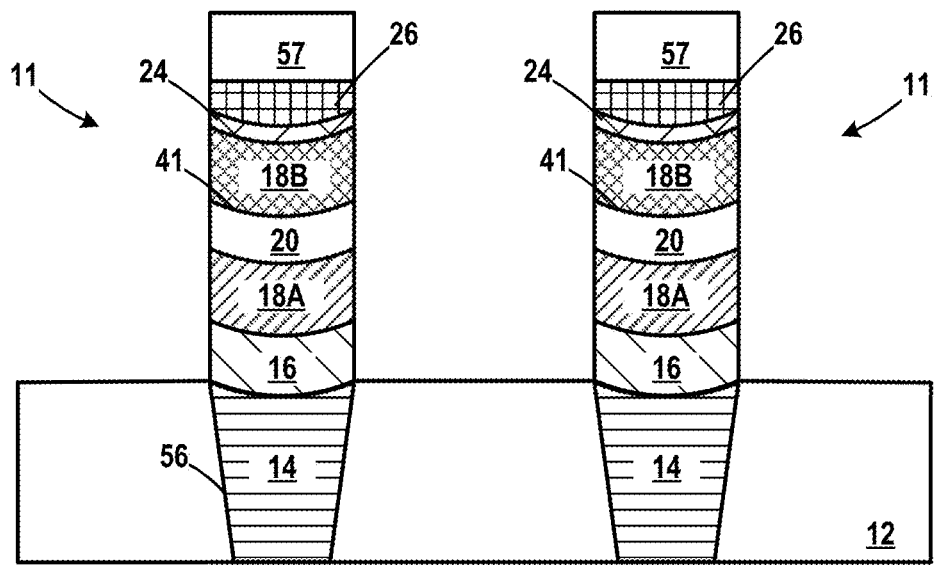

FIG. 10 depicts the IC product after several process operations were performed. First a patterned etch mask 57, e.g., a patterned layer of photoresist/BARC, was formed on the IC product 10 by performing traditional manufacturing techniques. Next, one or more etching processes, e.g., anisotropic etching processes, were performed through the patterned etch mask 57 to etch exposed portions of the layers 26, 24, 18B, 20, 18A and 16 so as to result in the formation of a plurality of STT-MRAM cells 11 with a curved interface 41 between the free ferromagnetic material layer 18B and the non-magnetic insulation layer 20. The STT-MRAM cells 11 may have a variety of different configurations or shapes when viewed from above. In the examples depicted herein, the STT-MRAM cells 11 will be patterned so as to have a substantially circular configuration when viewed from above. In the depicted example, the etching process is performed through the entire vertical thickness of the layer of bottom electrode material 16 and, as a result, the bottom electrodes 16 are discrete elements. Other process flows for forming the STT-MRAM cells 11 are, or course, possible. For example, in some cases, the etching process may be stopped at some location within the vertical thickness of the layer of bottom electrode material 16. In that case, a portion of the layer of bottom electrode material could function as a word line in a memory array.

Figure 11:
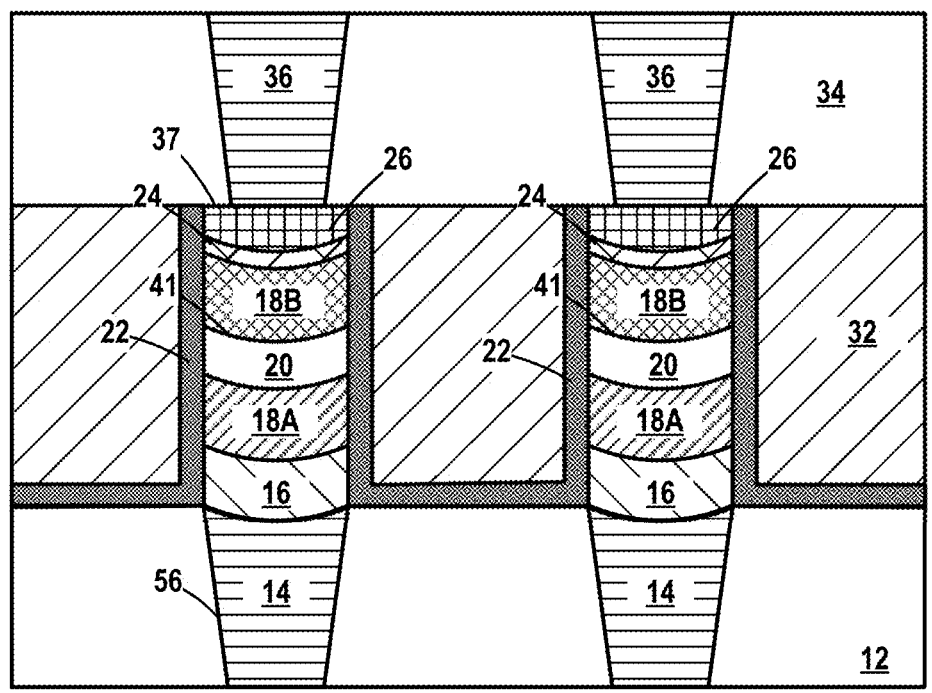

FIG. 11 depicts the IC product after several process operations were performed. First, the patterned etch mask 57 was removed. Next, a conformal deposition process was performed to form a conformal encapsulation layer 22 across the IC product 10. The conformal encapsulation layer 22 may be of any desired thickness and it may be comprised of any of a variety of different materials, e.g., SiN, SiC, SiCN, SiOCN, $Al_2O_3$, $HfO_x$, etc. As initially formed, the conformal encapsulation layer 22 covers the upper surface 37 of the top electrode 26 of each of the STT-MRAM cells 11. Thereafter, a representative layer of insulating material 32 was formed above the conformal encapsulation layer 22. The layer of insulating material 32 is intended to be representative in nature as it may in fact comprise multiple layers of material, e.g., insulating materials and etch stop layers. The layer of insulating material 32 may be of any desired thickness and it may be comprised of any of a variety of different materials, e.g., $SiO_2$, a low-k material, etc. Next, a CMP process was performed to remove the portions of the conformal encapsulation layer 22 positioned above the upper surface 37 of the top electrode 26 of the STT-MRAM cells 11 and to planarize the upper surface of the layer of insulating material 32.

Thereafter, and with continued reference to FIG. 11, a layer of insulating material 34 (e.g., silicon dioxide, a low-k material (k value less than 3.3)) was formed above the STT-MRAM cells 11. Next, illustrative separate conductive contact structures 36 (e.g., conductive vias) were formed in the layer of insulating material 34 so as to conductively contact the top electrode 26 of each of the STT-MRAM cells 11. The conductive contact structures 36 may be comprised of any conductive material, they may be of any desired configuration, and they may be manufactured using any of a variety of different known manufacturing techniques (e.g., single or dual damascene). As part of these process operations, contact openings would be formed in the layer of insulating material 34 above the top electrodes 26. If the portion of the conformal encapsulation layer 22 positioned above the upper surface 37 of the top electrodes 26 had not been previously removed, the portions of the conformal encapsulation layer 22 positioned above the upper surface 37 of the top electrodes 26 could be removed at this point in the process flow as well.

FIGS. 12-15 depict one illustrative process flow for forming the illustrative example of the novel STT-MRAM cell 11 depicted in FIG. 2. As before, prior to performing the processing operations shown in FIG. 12, various transistor devices (not shown), as well as various conductive contact structures (not shown) that are coupled to those transistor devices, were formed in and above the semiconductor substrate.

Figure 12:
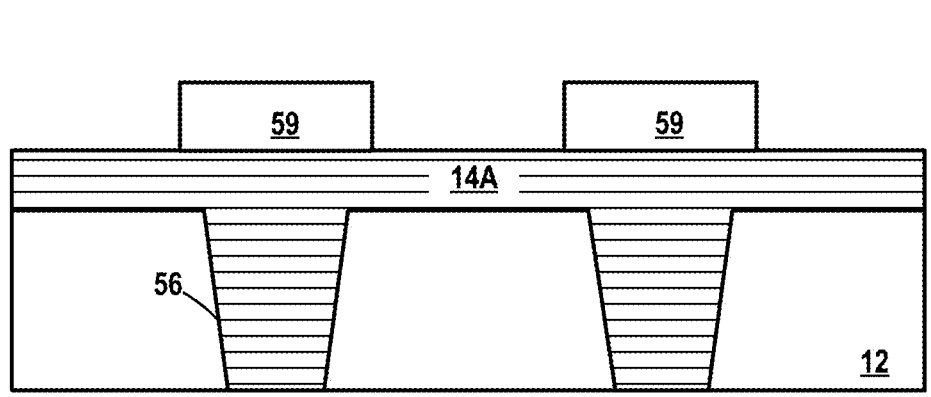

FIG. 12 depicts the IC product 10 after several process operations were performed. First, the above-described layer of insulating material 12 was formed at some level above the substrate. Then, one or more etching processes were performed thorough a patterned etch mask (not shown) to form a plurality of openings 56 (e.g., via openings) in the layer of insulating material 12. Thereafter, the patterned etch mask was removed. Next, the above-described one or more layers of conductive material 14A (that may include various liner layers and bulk conductive material) were formed so as to over-fill the openings 56. Next, a patterned etch mask 59 was formed above the layer of conductive material 14A. As depicted, the features of the etch mask 59 cover the area above the openings 56.

Figure 13:
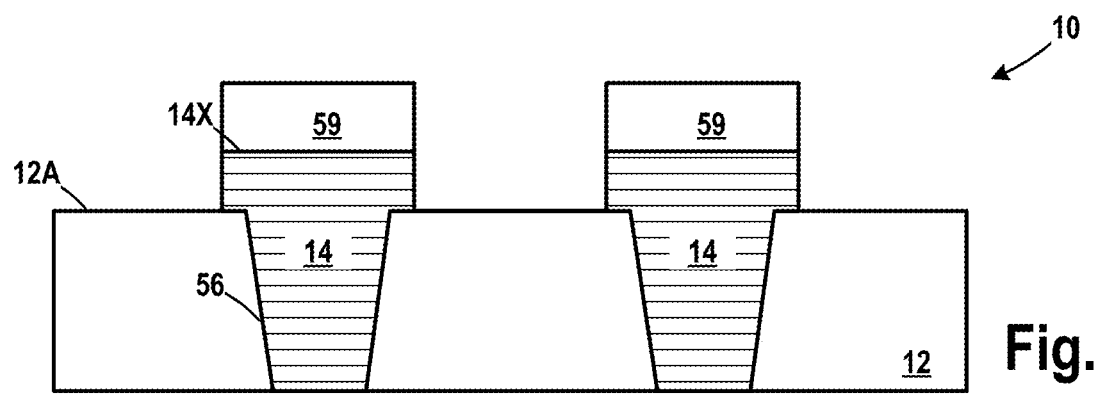

FIG. 13 depicts the IC product 10 after one or more etching processes were performed through the patterned etch mask 59 to remove exposed portions of the layer(s) of conductive material 14A. This results in the formation of a conductive structure 14 in each of the openings 56. Note that the upper surface 14X of the conductive structures 14 is positioned at a level that is above a level of the upper surface 12A of the layer of insulating material 12. The magnitude of the vertical difference between the upper surface 14X and the upper surface 12A may vary depending upon the particular application.

Figure 14:
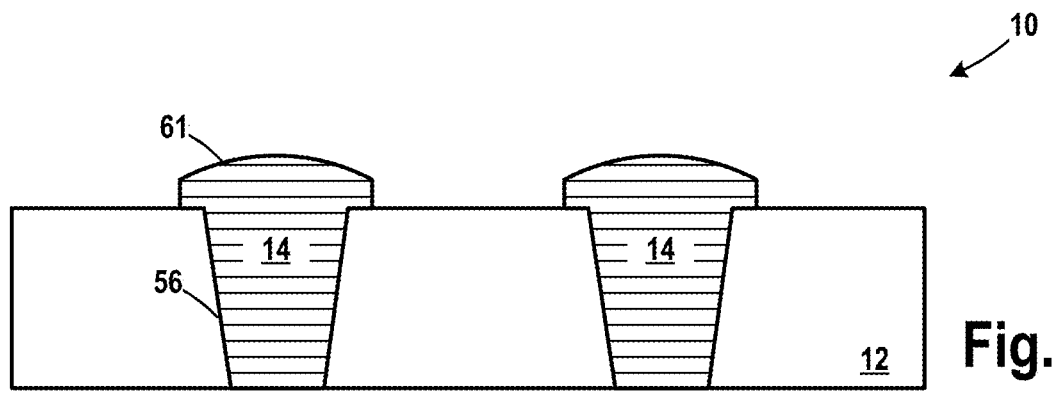

FIG. 14 depicts the IC product 10 after several process operations were performed. First, the patterned etch mask 59 was removed. Then, one or more controlled CMP and/or etch-back process operations were performed to remove portions of the upper surface 14X of the conductive structure 14. Note that, in one illustrative embodiment, the CMP and/or etch-back process operations are intentionally performed in such a manner that the conductive structures 14 have a curved, concave upper surface 61 relative to the substantially horizontally oriented upper surface (not shown) of the semiconductor substrate (not shown). This is in contrast to at least some prior art techniques where efforts are made to try to form the conductive structures 14 such that the upper surface of the conductive structures 14 is substantially flat. The degree of curvature of the upper surface 61 may vary depending upon the particular application.

Figure 15:
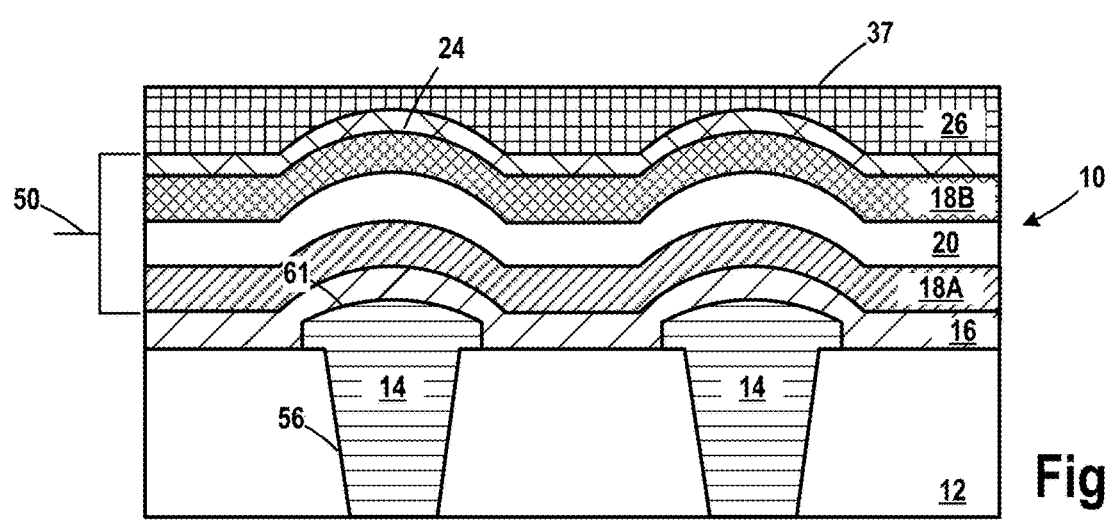

FIG. 15 depicts the IC product 10 after various layers of material are sequentially blanket deposited above the layer of insulating material 12. More specifically, the layer of bottom electrode material 16, the plurality of layers of material for the MTJ structure 50, the layer of top insulation material 24 and the layer of top electrode material 26 were sequentially deposited above the layer of insulating material 12. As depicted, in one illustrative embodiment, as initially deposited, the various deposited layers of material have a curved lower and upper surface at the locations above the concave upper surface 61 of the conductive structures 14. Thereafter, a CMP process operation was performed to planarize the upper surface 37 of the layer of top electrode material 26. At the point of processing depicted in FIG. 15, the processing operations described in connection with FIGS. 10 and 11 may be performed to complete this embodiment of the novel curved interface STT-MRAM cells 11 disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a bottom electrode on a conductive structure, the bottom electrode having a curved bottom surface conductively coupled to a curved upper surface of the conductive structure;
   a top electrode above the bottom electrode; and
   an MTJ (Magnetic Tunnel Junction) structure above the bottom electrode and below the top electrode, wherein the MTJ structure comprises:
      a first ferromagnetic material layer above the bottom electrode;
      a non-magnetic insulation layer above the first ferromagnetic material layer;
      a second ferromagnetic material layer on the non-magnetic insulation layer, wherein there is a curved, non-planar interface between the non-magnetic insulation layer and the second ferromagnetic material layer; and
      an insulation layer between the second ferromagnetic material layer and the top electrode.

2. The device of claim 1, wherein the memory cell is an STT-MRAM (spin transfer torque magnetic random access memory) device.

3. The device of claim 2, wherein the first ferromagnetic material layer is a pinned ferromagnetic material layer and wherein the second ferromagnetic material layer is a free ferromagnetic material layer.

4. The device of claim 1, further comprising a semiconductor substrate with a substantially horizontally oriented upper surface, wherein the curved, non-planar interface is a substantially concave surface relative to the substantially horizontally oriented upper surface.

5. The device of claim 1, further comprising a semiconductor substrate with a substantially horizontally oriented upper surface, wherein the curved, non-planar interface is a substantially convex surface relative to the substantially horizontally oriented upper surface.

6. The device of claim 1, wherein the non-magnetic insulation layer comprises a first curved upper surface and wherein the second ferromagnetic material layer comprises a first curved bottom surface that engages the first curved upper surface.

7. The device of claim 1, wherein the second ferromagnetic material layer is on and in physical contact with an upper surface of the non-magnetic insulation layer.

8. The device of claim 1, further comprising:
   a semiconductor substrate comprising a substantially horizontally oriented upper surface; and
   at least one layer of insulating material above the semiconductor substrate;
   wherein the conductive structure is in the at least one layer of insulating material, and the curved upper surface of the conductive structure is a convex upper surface relative to the substantially horizontally oriented upper surface of the semiconductor substrate.

9. The device of claim 1, further comprising:
   a semiconductor substrate comprising a substantially horizontally oriented upper surface; and
   at least one layer of insulating material above the semiconductor substrate, the at least one layer of insulating material comprising a substantially planar upper surface;
   wherein the conductive structure is in the at least one layer of insulating material, and the curved upper surface of the conductive structure is a concave upper surface relative to the substantially horizontally oriented upper surface of the semiconductor substrate, wherein an uppermost surface of the concave upper surface is at a level that is above a level of the upper surface of the at least one layer of insulating material.

10. The device of claim 1, wherein the bottom electrode comprises a curved upper surface that engages a curved bottom surface of the first ferromagnetic material layer, the first ferromagnetic material layer comprises a curved upper surface that engages a curved bottom surface of the non-magnetic insulation layer and the non-magnetic insulation layer comprises a curved upper surface that engages a curved bottom surface of the second ferromagnetic material.

11. The device of claim 1, further comprising a semiconductor substrate with a substantially horizontally oriented upper surface, wherein relative to the substantially horizontally oriented upper surface, the bottom electrode comprises a convex upper surface that engages a convex bottom surface of the first ferromagnetic material layer, the first ferromagnetic material layer comprises a convex upper surface that engages a convex bottom surface of the non-magnetic insulation layer and the non-magnetic insulation layer comprises a convex upper surface that engages a convex bottom surface of the second ferromagnetic material.

12. A device, comprising:
   a bottom electrode on a conductive structure, the bottom electrode having a curved bottom surface conductively coupled to a curved upper surface of the conductive structure;
   a top electrode above the bottom electrode; and
   an MTJ (Magnetic Tunnel Junction) structure above the bottom electrode and below the top electrode, wherein the MTJ structure comprises:
      a first ferromagnetic material layer above the bottom electrode;
      a non-magnetic insulation layer above the first ferromagnetic material layer, wherein the non-magnetic insulation layer comprises a first curved upper surface;
      a second ferromagnetic material layer on and in physical contact with the non-magnetic insulation layer, wherein the second ferromagnetic material layer comprises a first curved bottom surface that engages the first curved upper surface of the non-magnetic insulation layer; and
      an insulation layer between the second ferromagnetic material layer and the top electrode.

13. The device of claim 12, wherein the memory cell is an STT-MRAM (spin transfer torque magnetic random access memory) device and wherein the first ferromagnetic material layer is a pinned ferromagnetic material and wherein the second ferromagnetic material layer is a free ferromagnetic material layer.

14. The device of claim 12, wherein the engagement between the non-magnetic insulation layer and the second ferromagnetic material layer defines a curved, non-planar interface.

15. The device of claim 12, further comprising:
a semiconductor substrate comprising a substantially horizontally oriented upper surface; and
at least one layer of insulating material above the semiconductor substrate;
wherein the conductive structure in the at least one layer of insulating material, and the curved upper surface of the conductive structure is a convex upper surface relative to the substantially horizontally oriented upper surface of the semiconductor substrate.

16. The device of claim 12, further comprising:
a semiconductor substrate comprising a substantially horizontally oriented upper surface; and
at least one layer of insulating material above the semiconductor substrate, the at least one layer of insulating material comprising a substantially planar upper surface;
wherein the conductive structure is in the at least one layer of insulating material, and the curved upper surface of the conductive structure is a concave upper surface relative to the substantially horizontally oriented upper surface of the semiconductor substrate, wherein an uppermost surface of the concave upper surface is at a level that is above a level of the upper surface of the at least one layer of insulating material.

17. A device, comprising:
a bottom electrode on a conductive structure, the bottom electrode having a curved bottom electrode surface conductively coupled to a curved upper conductor surface of the conductive structure, and a first curved upper surface;
a top electrode above the bottom electrode; and
an MTJ (Magnetic Tunnel Junction) structure above the bottom electrode and below the top electrode, wherein the MTJ structure comprises:
a first ferromagnetic material layer comprising a second curved upper surface and a first curved bottom surface, wherein the first curved bottom surface contacts and engages the first curved upper surface;
a non-magnetic insulation layer comprising a third curved upper surface and a second curved bottom surface, wherein the second curved bottom surface contacts and engages the second curved upper surface;
a second ferromagnetic material layer comprising a fourth curved upper surface and a third curved bottom surface, wherein the third curved bottom surface contacts and engages the third curved upper surface; and
an insulation layer between the second ferromagnetic material layer and the top electrode.

18. The device of claim 17, further comprising a semiconductor substrate comprising a substantially horizontally oriented upper surface, wherein relative to the substantially horizontally oriented upper surface of the semiconductor substrate, the first, second, third and fourth upper surfaces are convex surfaces.

19. The device of claim 17, further comprising:
a semiconductor substrate comprising a substantially horizontally oriented upper surface; and
at least one layer of insulating material above the semiconductor substrate;
wherein the conductive structure is in the at least one layer of insulating material, and the curved upper conductor surface of the conductive structure is a convex upper surface relative to the substantially horizontally oriented upper surface of the semiconductor substrate.

20. The device of claim 17, further comprising:
a semiconductor substrate comprising a substantially horizontally oriented upper surface; and
at least one layer of insulating material above the semiconductor substrate, the at least one layer of insulating material comprising a substantially planar upper surface;
wherein the conductive structure is in the at least one layer of insulating material, and the curved upper conductor surface of the conductive structure is a concave upper surface relative to the substantially horizontally oriented upper surface of the semiconductor substrate, wherein an uppermost surface of the concave upper surface is at a level that is above a level of the upper surface of the at least one layer of insulating material.

* * * * *